(12) United States Patent
Coccioli et al.

(10) Patent No.: US 6,770,955 B1
(45) Date of Patent: Aug. 3, 2004

(54) SHIELDED ANTENNA IN A SEMICONDUCTOR PACKAGE

(75) Inventors: Roberto Coccioli, Simi Valley, CA (US); Mohamed A. Megahed, San Diego, CA (US); Trang N. Trinh, Cypress, CA (US); Larry D. Vittorini, Irvine, CA (US); John S. Walley, Ladera Ranch, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/020,105

(22) Filed: Dec. 15, 2001

(51) Int. Cl.[7] .................. H01L 23/552; H01L 23/48; H01L 23/52

(52) U.S. Cl. .................. 257/659; 257/660; 257/728; 257/774; 257/738; 257/780; 257/784; 257/787; 343/700 MS

(58) Field of Search .................. 257/659, 660, 257/774, 784, 728, 780, 738, 787; 343/700 MS, 846

(56) References Cited

U.S. PATENT DOCUMENTS 5,786,738 A * 7/1998 Ikata et al. .................. 333/133
6,265,774 B1 * 7/2001 Sholley et al. .............. 257/728
6,282,095 B1 * 8/2001 Houghton et al. .......... 361/704

FOREIGN PATENT DOCUMENTS

JP         09237867       * 9/1997

* cited by examiner

Primary Examiner—Eddie Lee
Assistant Examiner—Nitin Parekh
(74) Attorney, Agent, or Firm—Farjami & Farjami LLP

(57) ABSTRACT

One exemplary embodiment is a structure comprising a laminate substrate having a top surface for receiving a semiconductor die. The exemplary structure further comprises an antenna element situated on a bottom surface of the laminate substrate, where the antenna element is suitable for connection to the semiconductor die. According to this exemplary embodiment, the structure further comprises a laminate substrate reference pad in the laminate substrate, where the laminate substrate reference pad is situated over the antenna element. The exemplary structure further comprises at least one laminate substrate reference via situated at a side of the antenna element. The at least one laminate substrate reference via can be electrically connected to the laminate substrate reference pad. The at least one laminate substrate reference via can be electrically coupled to a printed circuit board reference via in a printed circuit board.

18 Claims, 3 Drawing Sheets

US 6,770,955 B1

SHIELDED ANTENNA IN A SEMICONDUCTOR PACKAGE

BACKGROUND OF THE INVENTION

1. Field of the Invention

The present invention is generally in the field of semiconductor die packaging. More specifically, the present invention is in the field of semiconductor die and discrete component packaging.

2. Background Art

The requirement of smaller, more complex, and faster devices operating at high frequencies, such as wireless communications devices and Bluetooth RF transceivers, has also resulted in an increased demand for small size antennas. Further, the decrease in size of wireless communication devices has created a demand for a small size antenna that is integrated in the same "package" housing the semiconductor die coupled to the antenna. However, integrating an antenna in the package housing the semiconductor die presents technical challenges.

For example, the antenna has to be miniaturized to enable the antenna to fit in the semiconductor die package. Also, the miniaturized antenna must be able to operate at high frequencies, such as the Bluetooth frequency range of approximately 2.40 GHz to 2.48 GHz. Although there are miniaturized antennas that are commercially available, these conventional miniaturized antennas are available only in a stand-alone configuration. In other words, these miniaturized antennas are available in a package that does not contain a semiconductor die. The stand-alone miniature antennas typically require relatively long interconnect lines to couple the stand-alone antennas to a transceiver or other device. The long interconnect lines result in "line losses" that decrease the performance of the wireless communication device.

As another example, since a stand-alone miniature antenna is a discrete component, the stand-alone miniature antenna requires assembly on a printed circuit board in the wireless communication device. Thus, the required assembly of the miniature antenna results in an increase in the manufacturing cost of the wireless communication device.

Another technical challenge in integrating an antenna in the package housing the semiconductor die is to sufficiently shield the semiconductor die from the antenna to avoid compromising the performance of the semiconductor die. Also, the antenna needs to be shielded from elements in the environment that can decrease the antenna's efficiency. In one approach to this challenge, a semiconductor die is mounted upside down in a cavity formed in the bottom of a multilayer ceramic substrate. In this approach, an antenna is fabricated above the semiconductor die in a metal layer in the multilayer ceramic substrate, and a ground plane is fabricated in a metal layer situated between the semiconductor die and the antenna. Thus, the ground plane utilized in this approach shields the semiconductor die from electromagnetic field radiated by the antenna. However, the above approach does not shield the sides of the antenna from the environment.

A slot antenna for semiconductor applications was reported in a paper by H. Rogier et al., "Design of an On-Package Slot Antenna for Bluetooth Applications," Proceedings of the 9$^{th}$ IEEE Topical Meeting on Electrical Performance of Electronic Packaging, pp. 292–295, Oct. 23–25, 2000 (European Patent no. 120418N pending). However, the slot antenna disclosed by Rogier et at, does not overcome various technical challenges such as those mentioned above.

Therefore, there exists a need for a properly shielded antenna that can be integrated in a semiconductor die package without increasing the manufacturing cost of the semiconductor die package.

SUMMARY OF THE INVENTION

The present invention is directed to a shielded antenna in a semiconductor package. The present invention overcomes the need in the art for a properly shielded antenna element that can be integrated in a semiconductor die package without increasing the manufacturing cost of the semiconductor die package by shielding the sides of an antenna fabricated on the bottom surface of a laminate substrate which also houses a semiconductor die.

One exemplary embodiment of the present invention is a structure comprising a laminate substrate having a top surface for receiving a semiconductor die. The laminate substrate can comprise an organic or ceramic material. The exemplary structure further comprises an antenna element situated on a bottom surface of the laminate substrate, where the antenna element is suitable for connection to the semiconductor die. The shape of the antenna element can be, for example, a square shape, a rectangular shape, a slot line pattern, a meander line pattern, or a patch pattern.

According to this exemplary embodiment, the structure further comprises a laminate substrate reference pad in the laminate substrate, where the laminate substrate reference pad is situated over the antenna element. The laminate substrate reference pad is generally at ground voltage, in which case it is referred to as a laminate substrate ground pad. The exemplary structure further comprises at least one laminate substrate reference via situated at a side of the antenna element. The at least one laminate substrate reference via can be electrically connected to the laminate substrate reference pad. By way of example, the at least one laminate substrate reference via can be at ground voltage in which case it is referred to as a laminate substrate ground via. The at least one laminate substrate reference via can be electrically coupled to a printed circuit board reference via in a printed circuit board. Moreover, the printed circuit board reference vias might be connected to a printed circuit board reference pad.

DETAILED DESCRIPTION OF THE INVENTION

The present invention is directed to a shielded antenna in a semiconductor package. The following description contains specific information pertaining to various embodiments and implementations of the invention. One skilled in the art will recognize that the present invention may be practiced in a manner different from that specifically discussed in the present application. Moreover, some of the specific details of the invention are not discussed in order not to obscure the invention. The specific details not described in the present application are within the knowledge of a person of ordinary skills in the art.

The drawings in the present application and their accompanying detailed description are directed to merely exemplary embodiments of the invention. To maintain brevity, other embodiments of the invention that use the principles of the present invention are not specifically described in the present application and are not specifically illustrated by the present drawings.

Figure 1:
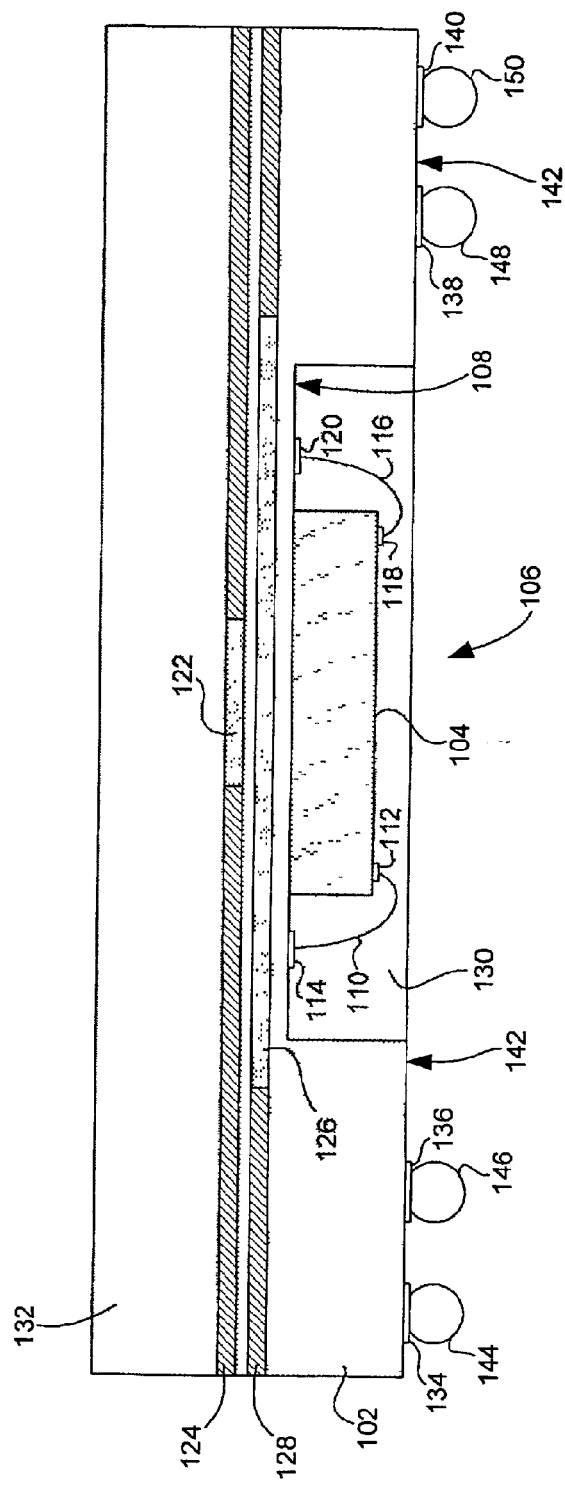
FIG. 1 illustrates a cross-sectional view of an exemplary conventional structure including an embedded antenna.

Structure 100 in FIG. 1 illustrates a cross-sectional view of a conventional exemplary "cavity down" BGA ("ball grid array") package. Structure 100 includes laminate substrate 102, which provides support for semiconductor die 104. Laminate substrate 102 might comprise, for example, a ceramic laminate material. As shown in FIG. 1, cavity 106 is formed in laminate substrate 102. Semiconductor die 104 is attached to a die attach pad, not shown in FIG. 1, on bottom surface 108 of cavity 106.

Also shown in FIG. 1, a first end of bonding wire 110 is bonded to semiconductor die bond pad 112, and a second end of bonding wire 110 is bonded to laminate substrate bond pad 114. A first end of bonding wire 116 is bonded to semiconductor die bond pad 118, and a second end of bonding wire 116 is bonded to laminate substrate bond pad 120. Bonding wires 110 and 116, respectively, provide an electrical connection between semiconductor die bond pads 112 and 118 and laminate substrate bond pads 114 and 120. Bonding wires 110 and 116 can comprise a suitable metal such as gold.

Further shown in FIG. 1, laminate substrate bond pads 114 and 120 are fabricated on bottom surface 108 of cavity 106. Laminate substrate bond pads 114 and 120 can comprise metals such as aluminum, copper, or gold. Also shown in FIG. 1, antenna element 122 is fabricated in metal layer 124 of laminate substrate 102. For example, antenna element 122 can be etched in metal layer 124 utilizing techniques known to a person of ordinary skill in the art. Antenna element 122 can comprise a metal such as copper.

Also shown in FIG. 1, ground pad 126 is fabricated in metal layer 128 of laminate substrate 102. Ground pad 126 provides shielding to semiconductor die 104 is from radiation emitting from antenna element 122. Further shown in FIG. 1, mold compound 130 encapsulates and thereby protects semiconductor die 104 and its bonding wires from chemical contamination or physical damage during use. Mold compound 130 can comprise various chemical compounds, such as multifunctional epoxy, novolac, and biphenyl resin, or a combination thereof Similar to mold compound 130, mold compound 132 encapsulates and protects components on the top surface of laminate substrate 102.

Also shown in FIG. 1, laminate substrate ball pads 134, 136, 138, and 140 are fabricated on bottom surface 142 of laminate substrate 102. Laminate substrate ball pads 134, 136, 138, and 140 can be copper, or can comprise other metals such as aluminum or gold. Solder balls 144, 146, 148, and 150, respectively, are situated on laminate substrate ball pads 134, 136, 138, and 140. Solder balls 144, 146, 148, and 150, respectively, can provide an electrical connection between laminate substrate ball pads 134, 136, 138, and 140, and a printed circuit board or other structure not shown in FIG. 1.

In exemplary conventional structure 100, antenna element 122 is shielded from the bottom by ground pad 126. However, antenna element 122 is not shielded from the environment on the sides of antenna element 122. Also, cavity 106 increases the manufacturing cost of structure 100 compared to a structure comprising a semiconductor as die situated on the top surface of a laminate substrate, since extra processing steps are required to form cavity 106 in laminate substrate 102.

Figure 2:
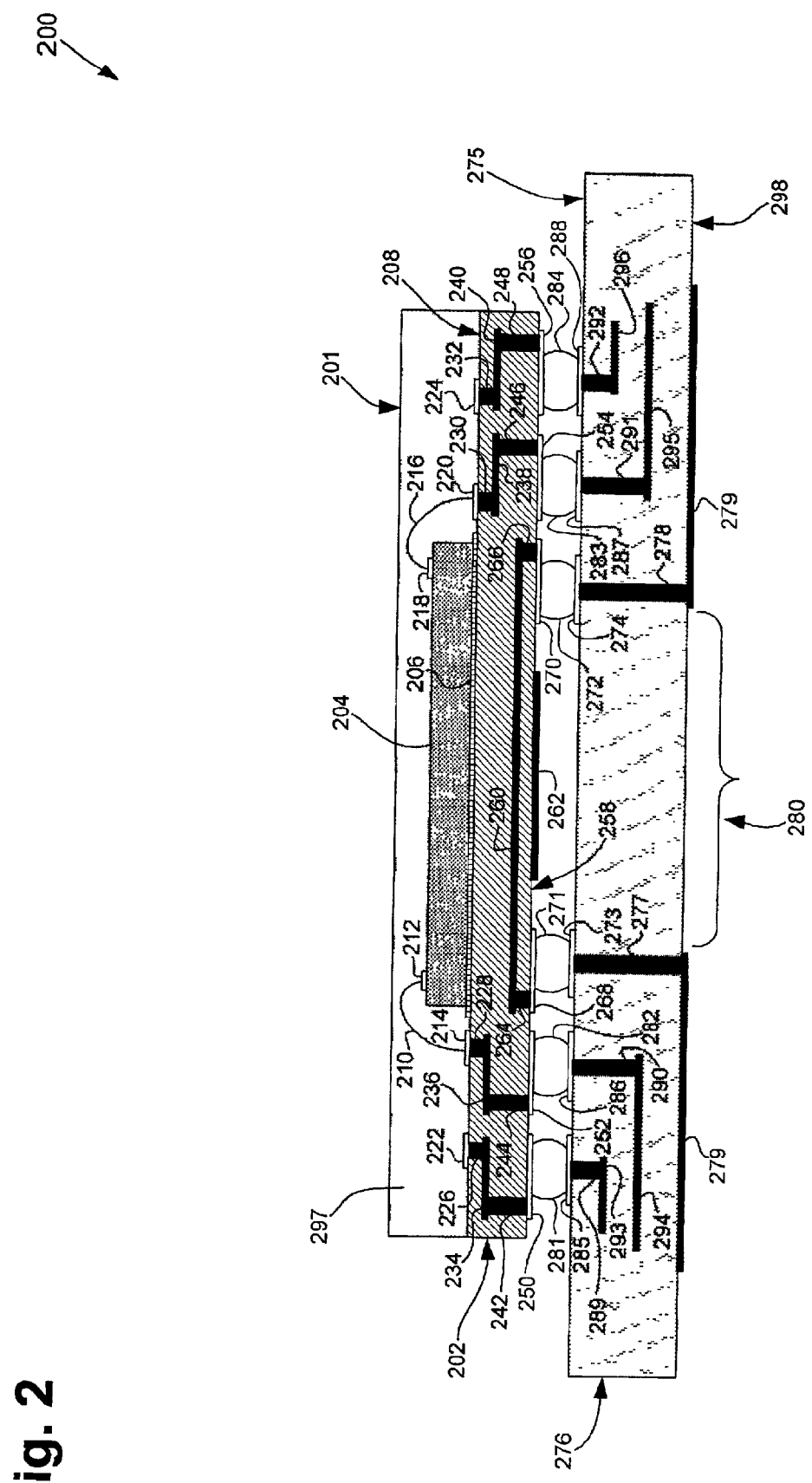
FIG. 2 illustrates a cross-sectional view of an exemplary structure in accordance with one embodiment of the present invention.

Structure 200 in FIG. 2 illustrates a cross-sectional view of an exemplary structure in accordance with one embodiment of the present invention. Structure 200 includes structure 201, which is situated on printed circuit board ("PCB") 276. Structure 201 includes laminate substrate 202, which provides support for semiconductor die 204. It is noted that a "semiconductor die," such as semiconductor die 204, is also referred to simply as a "die" in the present application. Laminate substrate 202 can comprise a ceramic material. In one embodiment, laminate substrate 202 can comprise an organic material such as polytetrafluoroethylene material or an FR4 based laminate material.

As shown in FIG. 2, semiconductor die 204 is attached to die attach pad 206 on top surface 208 of laminate substrate 202. Die attach pad 206 can comprise a AUS-5solder mask or other materials. Semiconductor die 204 is attached to die attach pad 206 by a die attach material, not shown in FIG. 2, such as silver-filled epoxy or bismalemide. Generally the die attach material can be an electrically conductive or electrically insulative, thermoset adhesive, or a combination thereof.

Also shown in FIG. 2, a first end of bonding wire 210 is bonded to semiconductor die bond pad 212 on semiconductor die 204, and a second end of bonding wire 210 is bonded to laminate substrate bond pad 214. Thus, bonding wire 210 provides an electrical connection between semiconductor die bond pad 212 and laminate substrate bond pad 214. Bonding wire 210 can be gold or can comprise other metals such as aluminum. A first end of bonding wire 216 is bonded to semiconductor die bond pad 218 on semiconductor die 204, and a second end of bonding Mire 216 is bonded to laminate substrate bond pad 220. Bonding wire 216 is similar to bonding wire 210 discussed above, and can comprise similar material as bonding wire 210. The diameter of bonding wire 210 or bonding wire 216 can be, for example, 30.0 microns or other diameter of choice.

As shown in FIG. 2, laminate substrate bond pad 214 is fabricated on top surface 208 of laminate substrate 202. In structure 200, laminate substrate bond pad 214 can comprise nickel-plated copper. Laminate substrate bond pad 214 can further comprise a layer of gold plating over the nickel-plated copper. However, laminate substrate bond pad 214 can comprise other metals, such as aluminum or gold. Laminate substrate bond pad 220 is fabricated on top surface 208 of laminate substrate 102. Laminate substrate bond pad 220 is similar to laminate substrate bond pad 214 discussed above, and comprises similar materials.

Also shown in FIG. 2, laminate substrate bond pads 222 and 224 are fabricated on top surface 208 of laminate substrate 202. Laminate substrate bond pads 222 and 224 are similar to laminate substrate bond pad 214 discussed above, and comprise similar material as laminate substrate bond pad 214. Further shown in FIG. 2, laminate substrate signal vias 226, 228, 230, and 232, respectively, provide a connection between laminate substrate bond pads 222, 214, 220, and 224 and laminate substrate traces 234, 236, 238, and 240. Laminate substrate signal vias 226, 228, 230, and 232 are situated in laminate substrate 202, and can comprise an electrically conductive metal, such as copper. Laminate substrate traces 234, 236, 238, and 240 are fabricated in a metal layer in laminate substrate 202, and can also comprise copper.

Further shown in FIG. 2, laminate substrate signal vias 242, 244, 246, and 248, respectively, provide a connection between laminate substrate traces 234, 236, 238, and 240 and laminate substrate ball pads 250, 252, 254, and 256. Similar to laminate substrate signal vias 226, 228, 230, and 232 discussed above, laminate substrate signal vias 242, 244, 246, and 248 are situated in laminate substrate 202, and can also comprise an electrically conductive metal, such as copper. Laminate substrate ball pads 250, 252, 254, and 256 are fabricated on bottom surface 258 of laminate substrate 202, and can comprise copper. Laminate substrate ball pads 250, 252, 254, and 256 can further comprise a layer of gold plating over the copper.

Also shown in FIG. 2, ground pad 260 is fabricated in a metal layer in laminate substrate 202. Ground pad 260 is situated between semiconductor die 204 and antenna element 262. Thus, ground pad 260 shields semiconductor die 204 from electromagnetic radiation emitted from antenna element 262. Ground pad 260 also provides a common ground connection, i.e. a "ground plane," for structure 201. Ground pad 260 can, for example, comprise copper. In one embodiment, ground pad 260 is a "reference pad" having a constant DC voltage with no AC component. In that embodiment, reference pad 260 can be, for example, coupled to the DC power source providing DC power to semiconductor die 204. Thus, ground pad 260 is a special case of a general reference pad 260 when the voltage at reference pad 260 is equal to the ground voltage. However, as stated above and in general, reference pad 260 can provide appropriate shielding for antenna element 262 so long as reference pad 260 is at a constant DC voltage with no AC component. It is noted that in the present application ground pad 260, or reference pad 260, are also referred to as laminate substrate ground pad 260, or laminate substrate reference pad 260, respectively.

Further shown in FIG. 2, laminate substrate ground vias 264 and 266, respectively, electrically connect ground pad 260 to laminate substrate ball pads 268 and 270. Laminate substrate ground vias 264 and 266 are fabricated in laminate substrate 202, and are situated on the sides of antenna element 262. Thus, laminate substrate ground vias 264 and 266 can shield the sides of antenna element 262 from elements in the environment that can detrimentally affect the operation of antenna element 262. Laminate substrate ground vias 264 and 266 are generally referred to as laminate substrate reference vias 264 and 266 in the embodiment where ground pad 260 is a "reference pad" where reference pad 260 can, in general, have a constant DC voltage different than the ground voltage.

Laminate substrate ground vias 264 and 266 (or reference vias 264 and 266) can comprise an electrically conductive metal, such as copper. Laminate substrate ground vias 264 and 266 (or reference vias 264 and 266) can shield semiconductor die 204 and laminate substrate signal vias 244 and 246 from electromagnetic radiation emitted by antenna element 262.

Laminate substrate ball pads 268 and 270 are fabricated on bottom surface 258 of laminate substrate 202. Laminate substrate ball pads 268 and 270 are similar to laminate substrate ball pads 250, 252, 254, and 256 discussed above, and can comprise similar materials as laminate substrate ball pads 250, 252, 254, and 256.

Further shown in FIG. 2, antenna element 262 is fabricated on bottom surface 258 of laminate substrate 202. Antenna element 262 can be fabricated on bottom surface 258 of laminate substrate 202 utilizing methods known to one of ordinary skill in the art. For example, a mask can be used to pattern conductors on a copper metallization layer on bottom surface 258 of laminate substrate 202. The excess copper can be etched away, resulting in a defined metal pattern that can include, for example, antenna element 262. Antenna element 262 can comprise a metal such as copper or gold. In one embodiment, antenna element 262 can comprise copper covered by a thin layer of gold.

In the present embodiment, antenna element 262 can be, for example, a square metal plate. By way of an example, each side of antenna element 262 can be 8.0 millimeters, and it (i.e. antenna element 262) can have a thickness of approximately 25.0 microns. In this example, an 8.0 millimeter by 8.0 millimeter size allows antenna element 262 to operate at a frequency of approximately 2.4 GHz. In another embodiment, antenna element 262 can have a different shape, such as a rectangular shape. In alternative embodiments, antenna element 262 can have a patch pattern, a meander line pattern, or a slot line pattern.

Antenna element 262 can be electrically connected to a semiconductor die bond pad on semiconductor die 204 by an electrical connection, i.e. an electrical "path," not shown in FIG. 2. For example, a trace on bottom surface 258 of laminate substrate 202 can electrically connect antenna element 262 to a via (not shown) in laminate substrate 202. This via can be electrically connected to a laminate substrate bond pad (not shown) on top surface 208 of laminate substrate 202. A bonding wire (not shown) can then electrically connect the laminate substrate bond pad discussed above and the semiconductor die bond pad (not shown) on semiconductor die 204.

Also shown in FIG. 2, ground solder balls 271 and 272, respectively, electrically connect laminate substrate ball pads 268 and 270 to PCB ball pads 273 and 274. Ground solder balls 271 and 272, respectively, are situated on the sides of antenna element 262, and are electrically connected to ground pad 260 by laminate substrate ball pads 268 and 270 and laminate substrate ground vias 264 and 266. Thus, ground solder balls 271 and 272 also shield the sides of antenna element 262 from the environment. PCB ball-pads 273 and 274 are fabricated on top surface 275 of PCB 276. PCB ball pads 273 and 274 can comprise copper or other metals such as aluminum or gold. When ground pad 260 is a reference pad, ground solder balls 271 and 272 are referred to as reference solder balls 271 and 272.

Further shown in FIG. 2, PCB ground vias 277 and 278, respectively, electrically connect PCB ball pads 273 and 274 to PCB ground pad 279. Thus, PCB ground vias 277 and 278, respectively, electrically couple ground pad 260 to PCB ground pad 279 by way of PCB ball pads 273 and 274, ground solder balls 271 and 270, laminate substrate ball pads 268 and 270, and laminate substrate ground vias 264 and 266. Also, PCB ground vias 277 and 278 are situated on the sides of antenna element 262. Thus, PCB ground vias 277 and 278 also shield antenna element 262 from the environment. Additionally, PCB ground vias 277 and 278, respectively, shield PCB signal vias 290 and 291 from electromagnetic radiation emitted from antenna element 262. As shown in FIG. 2, PCB ground vias 277 and 278 are fabricated in PCB 276 and can comprise copper. PCB ground pad 279 is fabricated on bottom surface 298 of PCB 276, and can also comprise copper. It is noted that unshielded region 280 in PCB ground pad 279 allows electromagnetic radiation to be emitted and received by antenna element 262. In the embodiment where ground pad 260 is a reference pad, PCB ground vias 277 and 278 are referred to as PCB reference vias 277 and 278 while PCB ground pad 279 is referred to as PCB reference pad 279.

Further shown in FIG. 2, solder balls 281, 282, 283, and 284, respectively, electrically connect laminate substrate ball pads 250, 252, 254, and 256 to PCB ball pads 285, 286, 287, and 288. PCB ball pads 285, 286, 287, and 288 are similar to PCB ball pads 273 and 274 discussed above, and comprise similar material as PCB ball pads 273 and 274. Also shown in FIG. 2, PCB signal vias 289, 290, 291, and 292, respectively, electrically connect PCB ball pads 285, 286, 287, and 288 to PCB traces 293, 294, 295, and 296. PCB signal vias 289, 290, 291, and 292 are fabricated in PCB 276 and can comprise copper. PCB traces 293, 294, 295, and 296 are fabricated in a metal layer in PCB 276. Signal traces 293, 294, 295, and 296 can comprise copper or other metal such as aluminum or gold.

As shown in FIG. 2, mold compound 297 encapsulates and thereby protects semiconductor die 204 and bonding wires 210 and 216 from chemical contamination or physical damage during use. Mold compound 297 can comprise various chemical compounds, such as multifunctional epoxy, novolac, and biphenyl resin or a combination thereof. Thus, FIG. 2 illustrates exemplary structure 200 according to one embodiment wherein a ground shield comprising ground pad 260 and laminate substrate ground vias 264 and 266 shield semiconductor die 204 from electromagnetic radiation emitted from antenna element 262, and also shield the sides of antenna element 262 from the environment. Moreover, ground solder balls 271 and 272 and also PCB ground vias 277 and 278 further shield the sides of antenna element 262 from the environment. Also, PCB ground vias 277 and 278 shield PCB signal vias, such as PCB signal vias 290 and 291, from antenna element 262.

Figure 3:
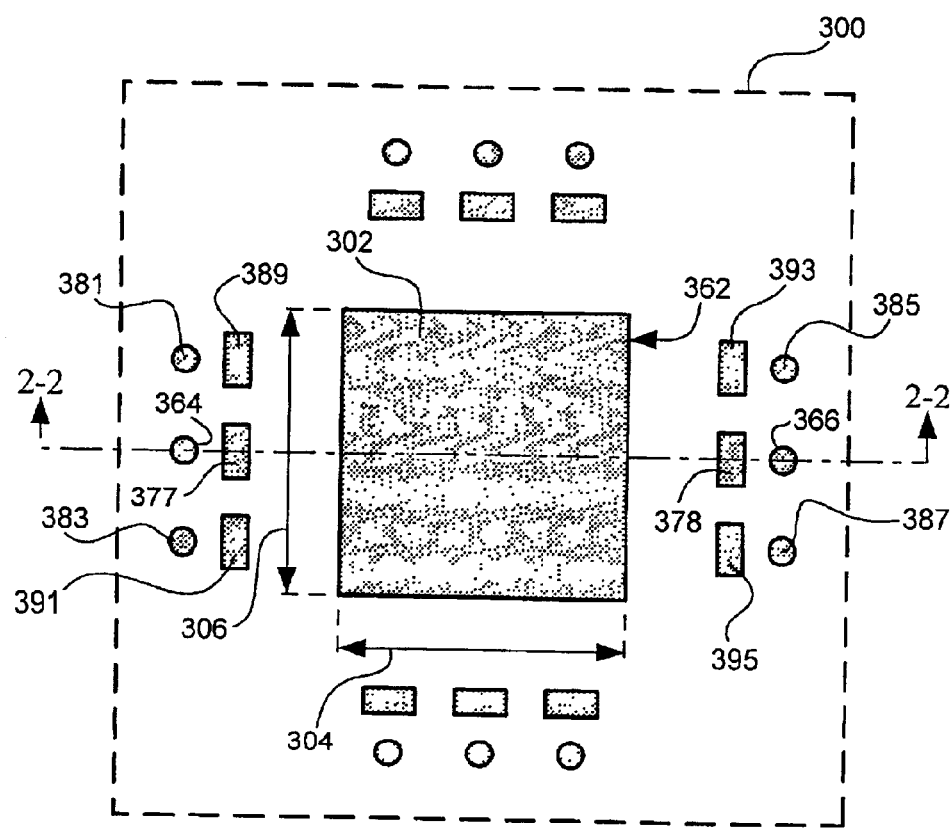
FIG. 3 illustrates a bottom view of a region of the exemplary structure of FIG. 2 in accordance with one embodiment of the present invention.

Region 300 in FIG. 3 illustrates a bottom view of selected elements in structure 200 in FIG. 2. Structure 200 in FIG. 2 corresponds to a cross-sectional view of region 300 along line 2-2 in FIG. 3. In particular, region 300 shows antenna element 362, which corresponds to antenna element 262 in FIG. 2. Also, region 300 shows laminate substrate ground vias, such as laminate substrate ground vias 364 and 366, respectively, which correspond to laminate substrate ground vias 264 and 266 in FIG. 2. Additionally, region 300 shows PCB ground vias, such as PCB ground vias 377 and 378, which correspond to PCB ground vias 277 and 278 in FIG. 2. It is noted that elements attached to laminate substrate ground vias and PCB ground vias, respectively, such as laminate substrate ball pads and PCB ball pads, are not shown in FIG. 3.

FIG. 3 shows bottom surface 302 of antenna element 362, which provides a surface for emitting or receiving electromagnetic radiation. In FIG. 3, antenna element 362 has a "plate" pattern. The plate can have, for example, a square shape such as that shown in FIG. 3 or, alternatively, the plate can have another shape, such as a rectangular shape. In exemplary square antenna element 362 shown in FIG. 3, width 304 of antenna element 362 may be approximately 8.0 millimeters and length 306 might be approximately 8.0 millimeters. In another embodiment, antenna element 362 can comprise a slot line pattern. In yet other embodiments, antenna element 362 can comprise a meander line pattern or a patch pattern.

Also shown in FIG. 3, laminate substrate ground vias, such as laminate substrate ground vias 364 and 366, are situated in a laminate substrate, such as laminate substrate 202 in FIG. 2. As shown in FIG. 3, other laminate substrate ground vias, such as laminate substrate ground vias 381, 383, 385, and 387 are also aligned in a row on each side of antenna element 362. These other laminate substrate ground vias 381, 383, 385, and 387 were not apparent and could not be shown in FIG. 2. Thus, the laminate substrate ground vias provide ground (or reference) "shields" on all sides of antenna element 362 in the laminate substrate. For example, the laminate substrate ground vias, such as laminate substrate ground vias 364 and 366, shield laminate substrate signal vias, such as laminate substrate signal vias 244 and 246 (in FIG. 2), respectively, from electromagnetic radiation emitted from antenna element 362. By way of another example, the laminate substrate ground vias also shield antenna element 362 from radiation in the surrounding environment that can adversely affect the performance of antenna element 362.

Further shown in FIG. 3, PCB ground vias, such as PCB ground vias 377 and 378, are situated in a PCB, such as PCB 276 in FIG. 2. The PCB ground vias are electrically connected to a PCB ground not shown in FIG. 3, such as PCB ground pad 279 in FIG. 2. PCB ground vias, such as PCB ground vias 377 and 378 are also coupled to laminate substrate ground vias, such as laminate substrate ground vias 364 and 366 through solder balls such as ground solder balls 271 and 272 (FIG. 2).

As shown in FIG. 3, other PCB ground vias, such as PCB ground vias 389, 391, 393, and 395 are also aligned in a row on each side of antenna element 362. These other PCB ground vias 389, 391, 393, and 395 were not apparent and could not be shown in FIG. 2. Thus, the PCB ground vias also provide ground (or reference) "shields" on an sides of antenna element 362. For example, the PCB ground vias shield PCB signal vias, such as PCB signal vias 290 and 291 in FIG. 2, from electromagnetic radiation emitted from antenna element 362. Similar to laminate substrate ground vias discussed above, the PCB ground vias also shield antenna element 362 from radiation in the surrounding environment that can adversely affect the performance of antenna element 362.

Referring back to FIG. 2, in contrast to structure 200 of the present invention, antenna element 122 in exemplary conventional structure 100 in FIG. 1 is not adequately shielded from the environment. Ground pad 126 in FIG. 1 only provides shielding between semiconductor die 104 and antenna element 122, and does not shield the sides of antenna element 122 from the environment.

Additionally, exemplary conventional structure 100 in FIG. 1 requires cavity 106 to be formed for semiconductor die 104 to be attached to laminate substrate 102. In contrast, the present invention provides a structure that does not require the additional processing cost of forming a cavity to place semiconductor die 204 in, since semiconductor die 204 is attached directly to top surface 208 of laminate substrate 202. Further, antenna element 262 in structure 200 is fabricated on laminate substrate 202, which also houses the semiconductor die, i.e. semiconductor die 204, that antenna element 262 is coupled to. As such, the present invention does not require the additional manufacturing cost of assembling an antenna element as a discrete component.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a shielded antenna in a semiconductor package has been described.

What is claimed is:

1. A structure comprising:
   a laminate substrate having a top surface for receiving a semiconductor die;
   an antenna situated on a bottom surface of said laminate substrate, said antenna being suitable for connection to said semiconductor die;
   a laminate substrate reference pad in said laminate substrate, said laminate substrate reference pad situated over said antenna;
   at least one laminate substrate reference via situated at a side of said antenna, said at least one laminate substrate reference via beings electrically connected to said laminate substrate reference pad, said at least one laminate substrate reference via being electrically connected to a printed circuit board reference pad in a printed circuit board.

2. The structure of claim 1 wherein said laminate substrate reference pad is a laminate substrate ground pad.

3. The structure of claim 1 wherein said at least one laminate substrate reference via is a laminate substrate ground via.

4. The structure of claim 1 wherein said at least one laminate substrate reference via is electrically connected to a printed circuit board reference via in said printed circuit board.

5. The structure of claim 4 wherein said printed circuit board reference via is connected to said printed circuit board reference pad.

6. The structure of claim 1 wherein said laminate substrate comprises an organic material.

7. The structure of claim 1 wherein said laminate substrate comprises a ceramic material.

8. The structure of claim 1 wherein a shape of said antenna is selected from the group consisting of a square shape, a rectangular shape, a slot line pattern, a meander line pattern, and a patch pattern.

9. The structure of claim 1 wherein said at least one laminate substrate reference via is electrically connected to a laminate substrate ball pad on said bottom surface of said laminate substrate.

10. A structure comprising:
    a laminate substrate having a top surface for receiving a semiconductor die;
    an antenna situated on a bottom surface of said laminate substrate, said antenna being suitable for connection to said semiconductor die;
    a laminate substrate reference pad in said laminate substrate, said laminate substrate reference pad situated over said antenna;
    a plurality of laminate substrate reference vias, each of said plurality of laminate substrate reference vias situated at a side of said antenna, said each of said plurality of laminate substrate reference vias being electrically connected to said laminate substrate reference pad, said each of said plurality of laminate substrate reference vias being electrically connected to a printed circuit board reference pad in a printed circuit board.

11. The structure of claim 10 wherein said laminate substrate reference pad is a laminate substrate ground pad.

12. The structure of claim 10 wherein said each of said plurality of laminate substrate reference vias is a laminate substrate ground via.

13. The structure of claim 10 wherein said each of said plurality of laminate substrate reference vias is electrically connected to a respective one of a plurality of printed circuit board reference vias in said printed circuit board.

14. The structure of claim 13 wherein each of said plurality of printed circuit board reference vias is electrically connected to said printed circuit board reference pad.

15. The structure of claim 10 wherein said laminate substrate comprises an organic material.

16. The structure of claim 10 wherein said laminate substrate comprises a ceramic material.

17. The structure of claim 10 wherein a shape of said antenna is selected from the group consisting of a square shape, a rectangular shape, a slot line pattern, a meander line pattern, and a patch pattern.

18. The structure of claim 10 wherein said each of said laminate substrate reference vias is electrically connected to a respective one of a plurality of laminate substrate ball pads on said bottom surface of said laminate substrate.

* * * * *